United States Patent
Liu et al.

(10) Patent No.: US 10,851,979 B2
(45) Date of Patent: Dec. 1, 2020

(54) BACKLIGHT LAMP BAR, BACKLIGHT MODULE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yufei Liu, Beijing (CN); Taesung Kang, Beijing (CN); Ming Zhai, Beijing (CN); Xiaoliang Fu, Beijing (CN); Ruifeng Yang, Beijing (CN); Litao Fan, Beijing (CN); Qiuxue Han, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/326,764

(22) PCT Filed: Apr. 16, 2018

(86) PCT No.: PCT/CN2018/083210
§ 371 (c)(1),
(2) Date: Feb. 20, 2019

(87) PCT Pub. No.: WO2018/223773
PCT Pub. Date: Dec. 13, 2018

(65) Prior Publication Data
US 2019/0203917 A1  Jul. 4, 2019

(30) Foreign Application Priority Data
Jun. 7, 2017 (CN) .......................... 2017 1 0425577

(51) Int. Cl.
*F21V 23/00* (2015.01)
*F21V 8/00* (2006.01)
(Continued)

(52) U.S. Cl.
CPC .............. *F21V 23/005* (2013.01); *F21S 8/00* (2013.01); *G02B 6/0068* (2013.01);
(Continued)

(58) Field of Classification Search
CPC .. G02B 6/0068; G02B 6/0073; G02B 6/0091; F21V 23/005
(Continued)

(56) References Cited

U.S. PATENT DOCUMENTS

2008/0112189 A1 * 5/2008 Okuda ................. G02B 6/0083
362/617
2008/0309844 A1 12/2008 Seo et al.
(Continued)

FOREIGN PATENT DOCUMENTS

CN    102155691 A    8/2011
CN    105446568 A    3/2016
(Continued)

OTHER PUBLICATIONS

First Chinese Office Action dated Jul. 24, 2019, received for corresponding Chinese Application No. 201710425577.0.
(Continued)

*Primary Examiner* — William J Carter
(74) *Attorney, Agent, or Firm* — Kinney & Lange, P.A.

(57) ABSTRACT

A backlight lamp bar, a backlight module and a display device are provided in embodiments of the disclosure, all being relating to a technical field of display technology, the backlight lamp bar as disclosed including: a flexible circuit board; and a backlight source and a button light source both being provided on the flexible circuit board; the backlight (Continued)

source and the button light source being located on two opposite faces of the flexible circuit board perpendicular to a thickness direction thereof, and power supply terminals of the backlight source and the button light source are electrically connected with circuits on the flexible circuit board, respectively.

14 Claims, 11 Drawing Sheets

(51) Int. Cl.
    *H05K 1/18*     (2006.01)
    *H05K 1/02*     (2006.01)
    *F21S 8/00*     (2006.01)
    *F21Y 115/10*     (2016.01)

(52) U.S. Cl.
    CPC ......... *G02B 6/0083* (2013.01); *G02B 6/0091* (2013.01); *H05K 1/028* (2013.01); *H05K 1/181* (2013.01); *F21Y 2115/10* (2016.08); *H05K 2201/10106* (2013.01); *H05K 2201/10113* (2013.01)

(58) Field of Classification Search
    USPC ........................................................ 362/613
    See application file for complete search history.

(56) References Cited

U.S. PATENT DOCUMENTS

| | | | |
|---|---|---|---|
| 2011/0128722 A1* | 6/2011 | Pan | G02F 1/133615 362/97.1 |
| 2011/0141042 A1 | 6/2011 | Kim et al. | |
| 2016/0365391 A1* | 12/2016 | Omata | H01L 51/5284 |
| 2019/0203917 A1 | 7/2019 | Liu et al. | |

FOREIGN PATENT DOCUMENTS

| | | |
|---|---|---|
| CN | 205263778 U | 5/2016 |
| CN | 105739141 A | 7/2016 |
| CN | 205405010 U | 7/2016 |
| CN | 205901821 U | 1/2017 |
| CN | 107102474 A | 8/2017 |
| KR | 20110065957 A | 6/2011 |

OTHER PUBLICATIONS

International Search Report and English Translation of Box V of the Written Report dated Jun. 6, 2018, received for corresponding PCT Application No. PCT/CN2018/083210.

* cited by examiner

BACKLIGHT LAMP BAR, BACKLIGHT MODULE AND DISPLAY DEVICE

CROSS-REFERENCE TO RELATED APPLICATION(S)

This application is a Section 371 National Stage Application of International Application No. PCT/CN2018/083210, filed on Apr. 16, 2018, entitled "BACKLIGHT LAMP BAR, BACKLIGHT MODULE AND DISPLAY DEVICE", which in turn claims priority to Chinese Patent Application Invention No. 201710425577.0 filed on Jun. 7, 2017 in the State Intellectual Property Office of China, the whole disclosure of which is incorporated herein by reference.

BACKGROUND OF THE DISCLOSURE

Field of the Disclosure

Embodiments of the present disclosure generally relate to the technical field of display technology, and in particular, to a backlight lamp bar, a backlight module and a display device.

Description of the Related Art

With a progress in technology, touch display devices have become used daily by more and more people, and requirements on touch display devices (e.g., large screen-to-body ratio, slim bezel, and the like) become increasingly high.

At present, in conventional touch display devices, e.g., touch screen mobilephones, it is typically required to thicken an optical adhesive/cement layer between a display panel and a cover glass layer (i.e., packaging glass), so as to provide a relatively large gap to accommodate a light source configured to provide illumination for area(s) other than a display area, e.g., a light source for a button area, with the light source for the button area and a backlight module for a display area being provided individually and separately.

SUMMARY OF THE DISCLOSURE

According to one aspect of embodiments of the disclosure, there is provided a backlight lamp bar, comprising: a flexible circuit board, and a backlight source and a button light source both being provided on the flexible circuit board; the backlight source and the button light source are located on two opposite faces of the flexible circuit board perpendicular to a thickness direction thereof, respectively.

According to an exemplary embodiment of the present disclosure, the backlight lamp bar further comprises a light guide film located at a light-emergent side of the button light source.

According to an exemplary embodiment of the present disclosure, the button light source comprises a first button light source and a second button light source, the light guide film being provided between the first button light source and the second button light source.

According to an exemplary embodiment of the present disclosure, power supply terminals of the backlight source and the button light source are electrically connected with circuits on the flexible circuit board, respectively.

According to an exemplary embodiment of the present disclosure, the button light source comprises: a first button light source located at a first end of the flexible circuit board.

According to an exemplary embodiment of the present disclosure, a light-emergent side of the first button light source is arranged to face towards a second end of the flexible circuit board, the second end being opposite to the first end.

According to an exemplary embodiment of the present disclosure, the button light source further comprises a second button light source located at a second end of the flexible circuit board, the second end being opposite to the first end.

According to an exemplary embodiment of the present disclosure, a light emergent side of the second button light source is arranged to face towards the first end of the flexible circuit board.

According to an exemplary embodiment of the present disclosure, the flexible circuit board is in a form of planar structure.

According to an exemplary embodiment of the present disclosure, at least one end of the flexible circuit board is provided with the button light source mounted thereon, and is arranged to bend towards a side of the flexible circuit board facing away from the backlight source.

According to an exemplary embodiment of the present disclosure, the at least one end of the flexible circuit board is arranged perpendicular to portions of the flexible circuit board having the backlight source thereon.

According to an exemplary embodiment of the present disclosure, each of the backlight source and the button light source is LED.

According to another aspect of the exemplary embodiment of the present disclosure, there is provided a backlight module, comprising the backlight lamp bar as above.

According to yet another aspect of the exemplary embodiment of the present disclosure, there is provided a display device, comprising: the backlight module as above; and a display panel provided on the backlight module.

According to an exemplary embodiment of the present disclosure, in a condition that the flexible circuit board is in a form of planar structure, the display panel is hollowed out at a location thereof being aligned with the button light source to form a hollowed portion, and the hollowed portion is arranged to expose a light-emergent side of the button light source through the hollowed portion to face towards a light-incident surface of the light guide film.

According to an exemplary embodiment of the present disclosure, the display device further comprises a sealing frame provided at a periphery of the backlight lamp bar and surrounding the display panel, wherein in a condition that at least one end of the flexible circuit board on which the button light source is provided is arranged to bend towards a side of the flexible circuit board facing away from the backlight source, a barrier wall is provided at portions of the sealing frame being aligned with ends of the backlight lamp bar in a lengthwise direction of the backlight lamp bar, and the barrier wall is provided with a notch; and wherein at least one end of the flexible circuit board on which the button light source is provided is arranged to be in contact with an external side of the barrier wall such that the light emergent side of the button light source extends into an inner side of the barrier wall through the notch and faces towards the light-incident surface of the light guide film.

According to an exemplary embodiment of the present disclosure, in a condition that at least one end of the flexible circuit board on which the button light source is provided is arranged to bend towards a side of the flexible circuit board facing away from the backlight source, the at least one end is configured to be adhered to the external side of the barrier wall by an adhesive film.

BRIEF DESCRIPTION OF THE DRAWINGS

In order to more clearly illustrate embodiments of the present disclosure or technical solutions in the related art, the drawings to be used in the description of the embodiments or the related art will be briefly described below. Obviously, the drawings in the following description merely represent some embodiments of the present disclosure, other drawings may be obtained by those skilled in the art from these drawings without creative efforts.

DETAILED DESCRIPTION OF PREFERRED EMBODIMENTS

Technical solutions of the present disclosure will be described clearly and completely with reference to the drawings of the embodiments in the present disclosure. It is apparent that the described embodiments are only part of embodiments of the present disclosure, rather than all of the embodiments. On the basis of the embodiments of the present disclosure, all of other embodiments that can be obtained by the skilled person in the art without any creative efforts also belong to the scope of the present disclosure.

Figure 1A:
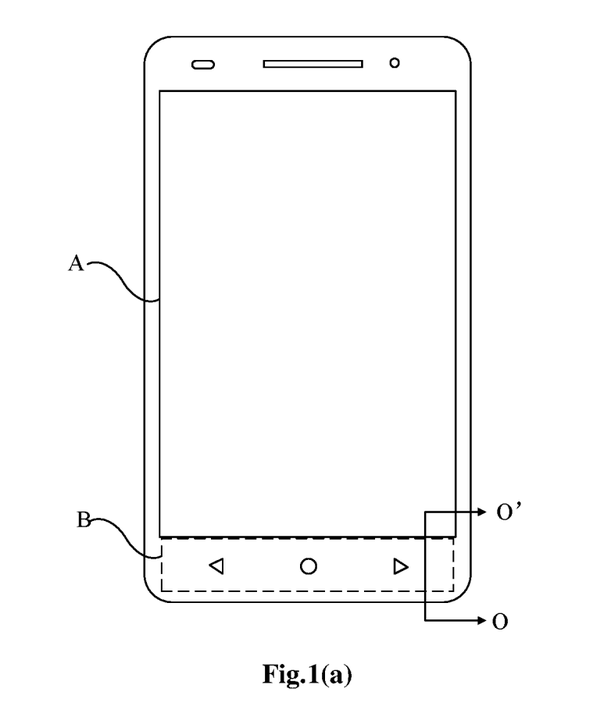
FIG. 1(a) illustrates a structural schematic view of a touch mobilephone.
Figure 1B:
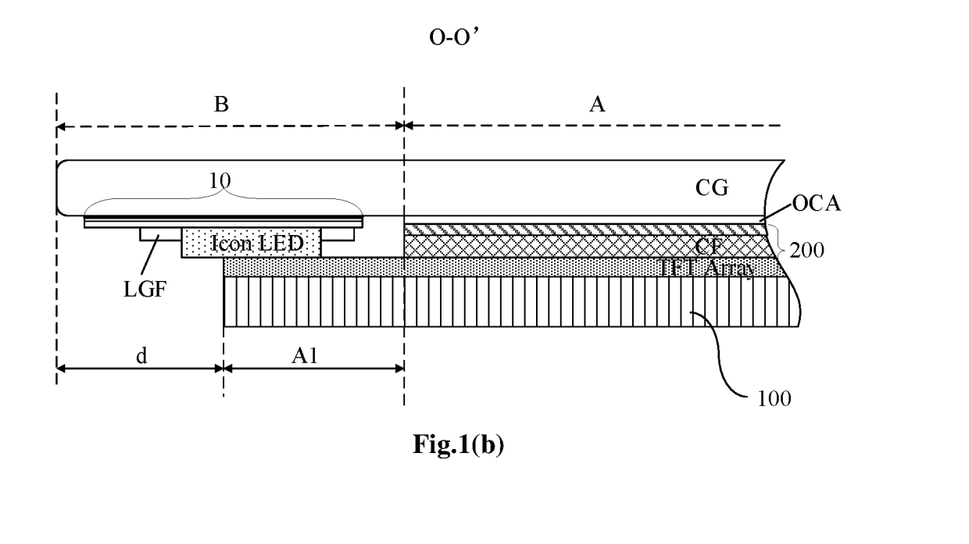
FIG. 1(b) illustrates a sectional structural schematic view along line O-O' as illustrated in FIG. 1(a)

By taking a touch mobilephone as an example, as illustrated in FIG. 1(a), an exemplary touch mobilephone comprises a display area (i.e., an Active Area (abbreviated as AA) disposed corresponding to a backlight source hereinafter) 'A' and a button area (i.e., an area corresponding to the button light source hereinafter) 'B'; as illustrated in FIG. 1(b) (a sectional view along line O-O' as illustrated in FIG. 1(a)), in a thickness direction of the mobilephone, a backlight module 100 (Back Light Unit, abbreviated as BLU), a display panel 200 (Panel) and a cover glass layer (abbreviated as CG) which are sequentially stacked. The backlight module 100 is configured to supply backlight required for implementing a normal display in Active Area. However, the button area B is less demanding in luminance of light incident thereon. Therefore, in relevant art, a button light source 10 is provided and configured to provide illumination and indication of the button area B, and the button light source 10 is arranged at a location on the cover glass layer corresponding to the button area B, e.g., an orthogonal projection of the button light source 10 on the cover glass layer is contained within an orthogonal projection of the button area B on the cover glass layer; and the button light source 1 is configured to provide backlight for the button area B.

As illustrated in FIG. 1(b), in a longitudinal direction (i.e., a lengthwise direction) of the mobilephone, since a length of the button light source 10 in this direction is larger than a length 'd' of a portion of the cover glass layer CG beyond the backlight module 100. Therefore, it is required that the button light source 10 is located adjacent to a single-substrate region 'A1' in the display panel 200 ("single-substrate region" means that, in a thickness direction perpendicular to a longitudinal direction of the mobilephone, such a region comprises merely a portion of an array substrate, rather than any portion of a color filter substrate; i.e., it refers to an edge region of the array substrate labeled 'TFT Array' in the display panel 200 beyond the color filter substrate CF, as illustrated); and in the thickness direction of the mobilephone, the button light source 10 is a multi-layer structure which generally comprises a silver paste layer, an adhesive layer, a flexible printed circuit layer (abbreviated as FPC) and a button lamp (i.e., Icon LED) and the like. And in the single-substrate region A1, a thickness of a gap between the array substrate 'TFT Array' and the cover glass layer 'CG' thereabove is about 0.4 mm, less than an overall thickness of the button light source 10, such that the gap may not accommodate the button light source 10 therein; therefore, it is required to add an Optical Clear Adhesive (abbreviated as OCA) layer, or an additional spacing layer which is separately and individually disposed, between the display panel 200 and the cover glass layer 'CG', such that it is difficult to implement a thinner and lighter design of the display device.

Continuing to refer to FIG. 1(b), a relevant exemplary setting of the button light source 10 is for example implemented by providing a separate button light source 10 which is separated from the backlight module of the display area A and a flexible circuit board which is configured to control the button light source 10, at an end of the cover glass layer CG adjacent to the display panel 200, and the button light source 10 is arranged such that a light-emergent direction of the button light source 10 is approximately parallel to a plane where a light guide plate is situated, for example, in a relevant art, a miniature surface light source is formed by providing a light guide film (abbreviated as LGF) which is parallel to a surface of the display panel 200 (especially its button area B) at a light-emergent side of the button light source 10, so as to meet requirements of the entire button area B on backlight.

Moreover, as illustrated in FIG. 1(b), as far as an exemplary setting of the button light source 10 concerning specific dimensions is concerned, within a range of the single-substrate region A1 of the display panel 200, there is a multi-layer structure provided on the cover glass layer CG, comprising: the silver paste layer (having an exemplary thickness of about 0.03 mm), a FPC adhesive layer (having an exemplary thickness of about 0.03 mm), the FPC layer (having an exemplary thickness of about 0.12 mm), the button light source (having an exemplary thickness of about 0.35 mm), all of which are sequentially stacked and have respective exemplary thicknesses depending on processes. Thereby, the multi-layer structure has an overall thickness of about 0.53 mm; and in comparison, a gap between a package of the display panel and the single-substrate region A1 of the display panel 200 is exemplarily set to have a height of 0.4 mm, resulting in that the gap may not be sized sufficient to accommodate the entire button light source 10 normally. Therefore, it is required to increase the height of the gap, and it is necessary to increase the thickness of the display panel.

A backlight lamp bar, a backlight module and a display device are provided in embodiments of the disclosure, with an integrated setting in which the display backlight and the button backlight are provided integrally; as such, specific technical solutions thereof differ from a condition of relevant art in which the display backlight module and the button backlight module are manufactured individually, facilitating implementation of a thinner and lighter design of the display device.

Figure 2:
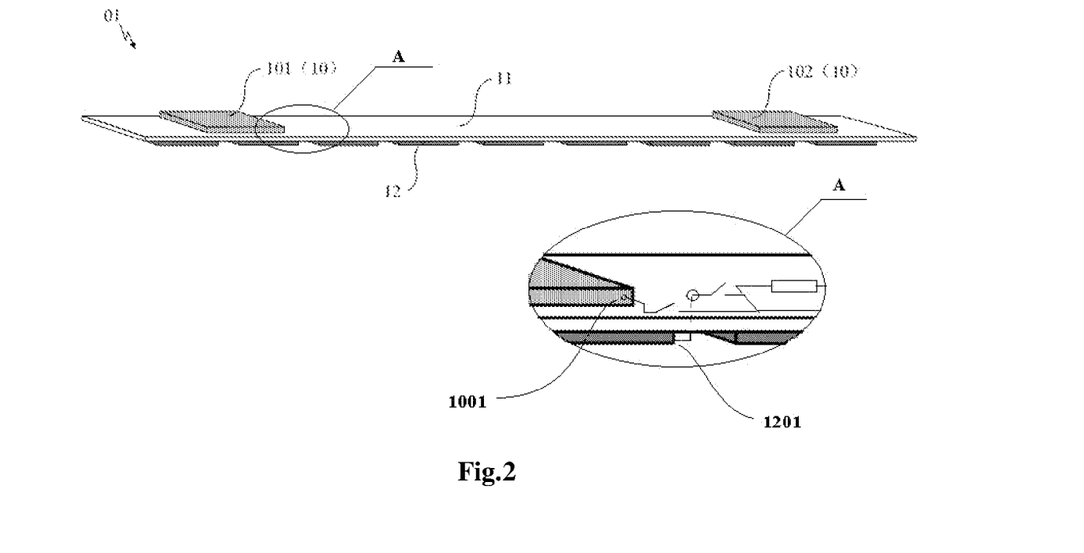
FIG. 2 illustrates a structural schematic view of a backlight lamp bar according to an embodiment of the disclosure.
Figure 6:
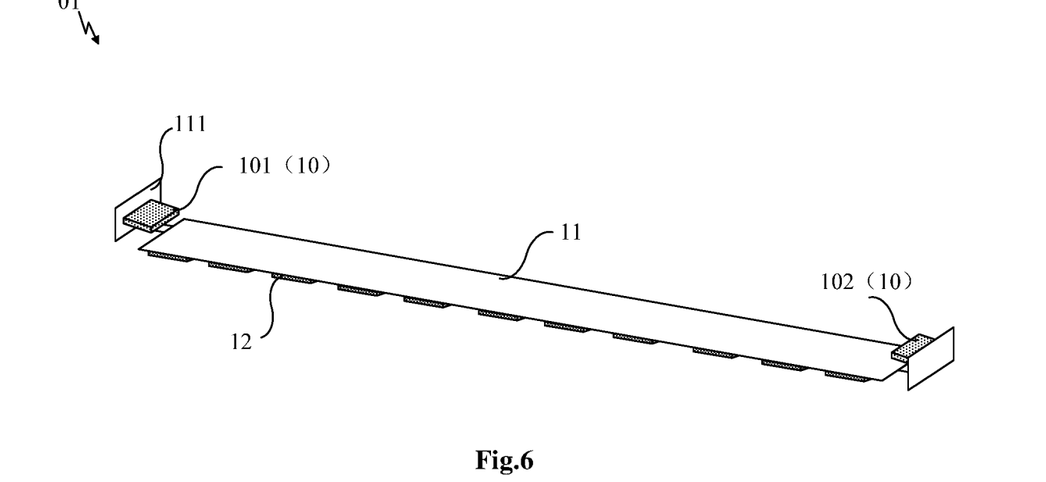
FIG. 6 illustrates a structural schematic view of another backlight lamp bar according to an embodiment of the disclosure.

According to a general technical concept of the embodiments of the disclosure, in an aspect of embodiments of the disclosure, as illustrated in FIG. 2 and FIG. 6, by way of example, the backlight lamp bar 01 comprises: a flexible circuit board 11, and a backlight source 12 and a button light source 10 both disposed on the flexible circuit board 11; and the backlight source 12 and the button light source 10 are spaced apart from each other and are located on two opposite surfaces of the flexible circuit board 11 perpendicular to the thickness direction, respectively. Generally, the backlight source 12 and the button light source 11 as above are for example light emitting diodes (abbreviated as LED).

By above settings, it is possible to implement a control on both the backlight source and the button light source simultaneously by merely a flexible circuit board; in other words, i.e., in a condition that above settings are applied to the display device, the button light source is directly controlled by the flexible circuit board within the backlight lamp bar, and the solutions of embodiments of the disclosure thus differ from a solution in relevant art in which a dedicated flexible circuit board which is used for the button light source is additionally provided between the display panel and a packaging cover plate and thus results in a relatively large thickness of the display device.

Further specific description of the backlight lamp bar 01 are set forth in detail, hereinafter.

In a condition that above backlight lamp bar 01 is applied to the backlight module, the backlight source 12 and the light guide plate are placed to face towards each other, e.g., abutting against each other, such that the light rays emitted by the backlight source 12 are transmitted to the light guide plate, and then the light rays pass through the light guide plate to output therefrom at a same side as the light-emergent side of the button light source, such that the light rays from the backlight source 12 may be outputted through the light guide plate as much as possible, so as to minimize loss of light rays and to ensure that an illumination range of the light rays may be sufficient to cover the entire button area, satisfying requirements of the display device on the backlight.

In an embodiment of the disclosure, the backlight lamp bar may for example comprise a light guide film located at the light-emergent side of the button light source. Specifically, as compared with the setting of the button light source 10 in relevant art, in contrast, as illustrated in FIG. 2, in the embodiment of the disclosure, the button light source 10 and the backlight source 12 both in the backlight lamp bar 01 share the flexible circuit board 11. In such a condition, the light-emergent direction of the button light source 10 in the embodiment of the disclosure may for example be set to be identical to that in relevant art (i.e., a light-emergent direction being approximately parallel to the plane where the light guide plate is situated), and light rays exiting there pass through a light guide film LGF located at the light-emergent side (more specifically, parallel to a surface of the display panel 200 (especially its button area A)) so as to form the miniature surface light source, such that the light guide film transmits light rays uniformly and has an illumination range thereof sufficient to cover the entire button area to meet requirements of the entire button area on uniform backlight illumination. Certainly, the light-emergent direction of the button light source 10 of the embodiment of the disclosure may further be provided approximately perpendicular to the plane where the light guide plate is situated, and facing towards the cover glass layer CG, such that the button light source 10 is provided at a certain location within the button area B as required, without providing the light guide film LGF.

In an embodiment of the disclosure, for example, the button light source comprises a first button light source and a second button light source, with the light guide film being provided between the first button light source and the second button light source.

In an embodiment of the disclosure, for example, power supply terminals of the backlight source 12 and the button light source 10 are electrically connected (e.g., as illustrated, a power supply terminal 1001 of the button light source 101, and a power supply terminal 1201 of the backlight source 12) with circuits on the flexible circuit board 11, respectively. As illustrated in a partial enlargement view A of FIG. 2, only by way of example, the power supply terminal 1001 of the button light source 101 is electrically connected with circuits which are routed on an upper surface of the flexible circuit board 11, e.g., by plug-in mounting of DIP (i.e., Dual In-line Package) type as illustrated; and the power supply terminal 1201 of the backlight source 12 is electrically connected with the circuits which are routed on the upper surface of the flexible circuit board 11, from a back side surface of the latter, e.g., by plug-in mounting of THT (i.e., Through-Hole Technology) type as illustrated.

It is merely an exemplary solution in the embodiment of the disclosure that the entire button area is covered with uniform backlight, by providing the light guide film LGF as above.

Specific configuration of the backlight lamp bar 01 is further set forth the in detail hereinafter, by specific embodiments meeting above requirements.

Specifically, by way of example, as illustrated in FIG. 2, in the backlight lamp bar 01, the flexible circuit board 11 is in a form of planar structure, and the backlight source 12 and the button light source 10 are located on two opposite faces of the flexible circuit board 11 perpendicular to a thickness direction thereof, respectively. In such a condition, in order to ensure that light rays emitted by the button light source 10 may be outputted through the light guide film as much as possible so as to minimize loss of light rays and to ensure that an illumination range of the light rays may be sufficient to cover the entire button area and thus to satisfy requirements of the entire button area B on the backlight, then, in the embodiment of the disclosure, e.g., the button light source comprises: a first button light source 101 which is located at a first end (e.g., a left side end as illustrated) of the flexible circuit board 11; and correspondingly, a light-emergent side of the first button light source 101 is arranged to face towards a second end of the flexible circuit board 11. Additionally or alternatively, the button light source comprises a second button light source 102 which is located at the second end (e.g., a right side end opposite to the left side end which functions as the first end) of the flexible circuit board 11 different from the first end; and correspondingly, a light-emergent side of the second button light source 102 is arranged to face towards the first end of the flexible circuit board 11. As such, since a single button light source 10 (i.e., the first button light source 101, the second button light source 102) is provided at one of ends of the flexible circuit board 11, then, when it applied to a display device, by providing the light guide film LGF at the light-emergent side of a single button light source 10 and corresponding to the button area, then it may be possible to meet requirements of the entire button area B on uniform backlight illumination.

FIG. 2 merely illustrates by taking the button light source 10 (i.e., the first button light source 101 and the second button light source 102) provided at the first end and the second end of the flexible circuit board 11 respectively as an example, intending to ensure a uniformity of luminance within the button area B. In such a condition, it may be readily understood by those skilled in the art that, the light guide film LGF is provided at a corresponding position between the first button light source 101 and the second button light source 102. As an alternative example, a single button light source 10 may also for example be provided merely at one end (the first end or the second end) of the flexible circuit board 11.

In another embodiment of the disclosure, e.g., as illustrated in FIG. 6, in the backlight lamp bar 01, one end of the flexible circuit board 11 at which the button light source 10 is provided is configured to bend towards a side of the flexible circuit board facing away from the backlight source 12, i.e., the button light source 10 is provided at a bending portion 111 of the button light source 10, at the end of the flexible circuit board 11. In such a condition, in order to ensure that the light rays emitted by the button light source 10 may be outputted through the light guide film LGF as much as possible, so as to minimize loss of light rays and to ensure that the illumination range of the light rays may be sufficient to cover the entire button area and thus to satisfy requirements of the entire button area B on illumination of the backlight, then, in the embodiment of the disclosure, e.g., the button light source comprises: a first button light source 101 which is located at a first end of the flexible circuit board 11, and/or a second button light source 102 which is located at a second end of the flexible circuit board 11; a light-emergent side of the first button light source 101 is arranged to face towards the second end of the flexible circuit board 11, and a light-emergent side of the second button light source 102 is arranged to face towards the first end of the flexible circuit board 11.

As such, since the button light source 10 (i.e., at least one of the first button light source 101 and the second button light source 102) is provided at an end or ends of the flexible circuit board 11, then, in a condition that the backlight module comprising the backlight lamp bar 01 is applied to a display device, by providing the light guide film LGF at the light-emergent side of the button light source 10 and corresponding to the button area B, then it may be possible to meet requirements of the entire button area on uniform backlight illumination.

FIG. 6 merely illustrates by taking the button light source 10 provided at both the first end and the second end of the flexible circuit board 11 respectively as an example, intending to ensure a uniformity of luminance within the button area. In such a condition, it may be readily understood by those skilled in the art that, the light guide film LGF is provided between the first button light source 101 and the second button light source 102. Alternatively, a single button light source 10 may also be provided merely at one end (the first end or the second end) of the flexible circuit board 11.

Combining one embodiment as above and another embodiment as above, solutions of embodiments of the disclosure are further described with specific numerical values.

Figure 5:
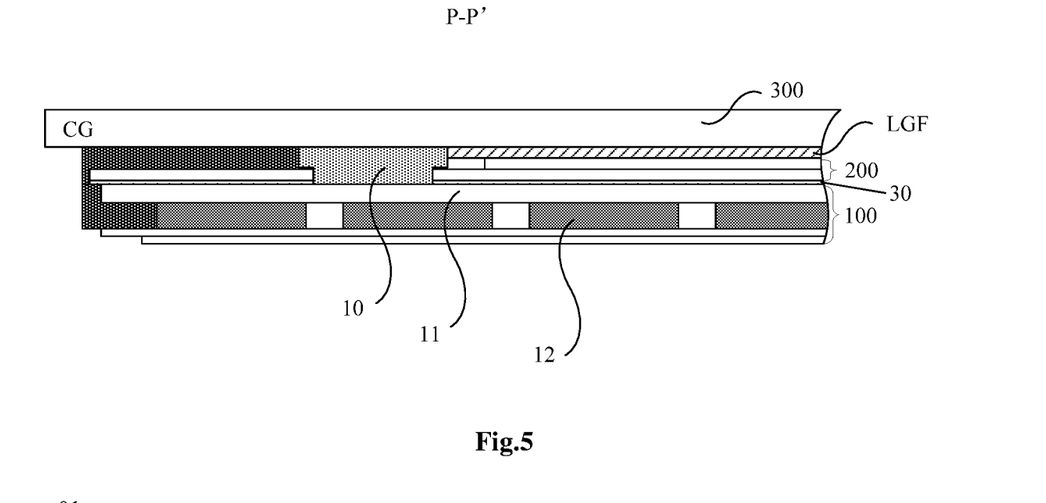
FIG. 5 illustrates a sectional structural schematic view along line P-P' as illustrated in FIG. 4.
Figure 11:
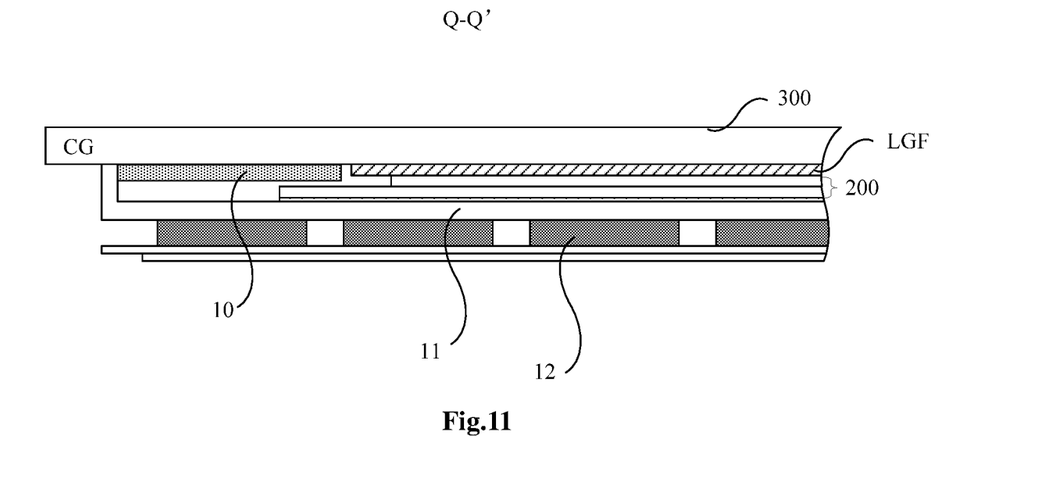
FIG. 11 illustrates a sectional structural schematic view along line Q-Q' as illustrated in FIG. 10.

As to a setting concerning specific dimensions of a relevant structure of the backlight lamp bar according to the embodiment of the disclosure, by way of example, as illustrated in FIGS. 5 and 11, in a single-substrate region A1 of the display panel 200, it is only required that a thickness of the button light source 10 itself may be set to ensure that the button light source 10 may be accommodated within the height of the gap between the package 300 and the single-substrate region A1 of the display panel 200. In a general example, the thickness of the button light source 10 itself may for example be chosen to be about 0.35 mm, and the height of the gap between the package 300 and the position of the single-substrate region A1 of the display panel 200 may for example be chosen to be about 0.4 mm, so as to accommodate the button light source 10 therein normally.

In another aspect of embodiments of the disclosure, there is further provided a backlight module, which comprises the backlight lamp bar as above and thus has a structure and beneficial effects identical to the backlight lamp bar as provided in aforementioned embodiments. In aforementioned embodiments, both the structure and the beneficial effects of the backlight lamp bar are depicted in detail already, without being repeated herein any more.

In still another aspect of embodiments of the disclosure, there is further provided a display device, which comprises a sealing frame; and a backlight module, a display panel and a packaging cover plate which are sequentially stacked on the sealing frame, and thus has a structure and beneficial effects identical to the backlight lamp bar as provided in aforementioned embodiments. In aforementioned embodiments, both the structure and the beneficial effects of the backlight lamp bar are depicted in detail already, without being repeated herein any more.

Figure 3:
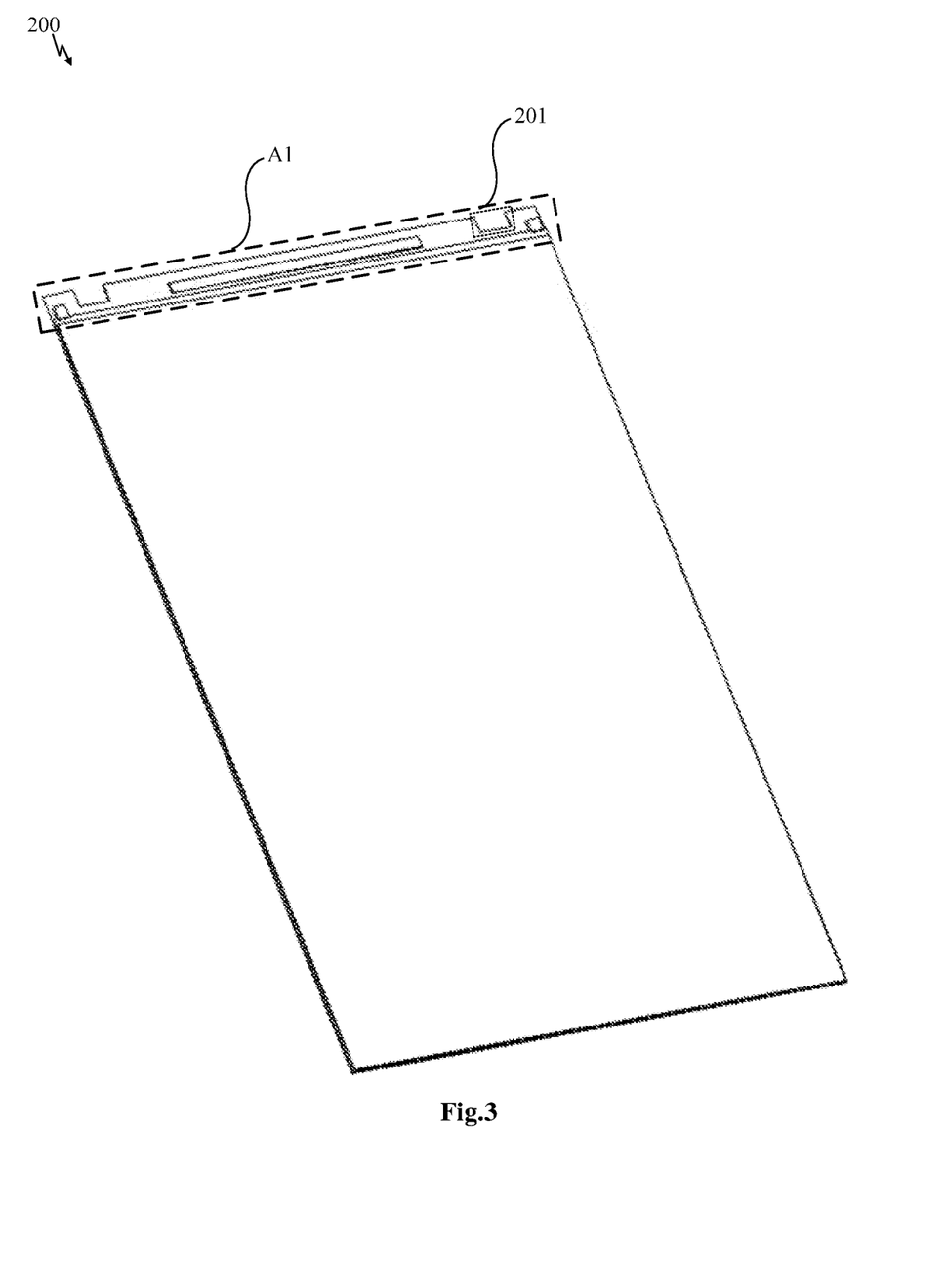
FIG. 3 illustrates a structural schematic view of a display panel according to an embodiment of the disclosure.
Figure 4:
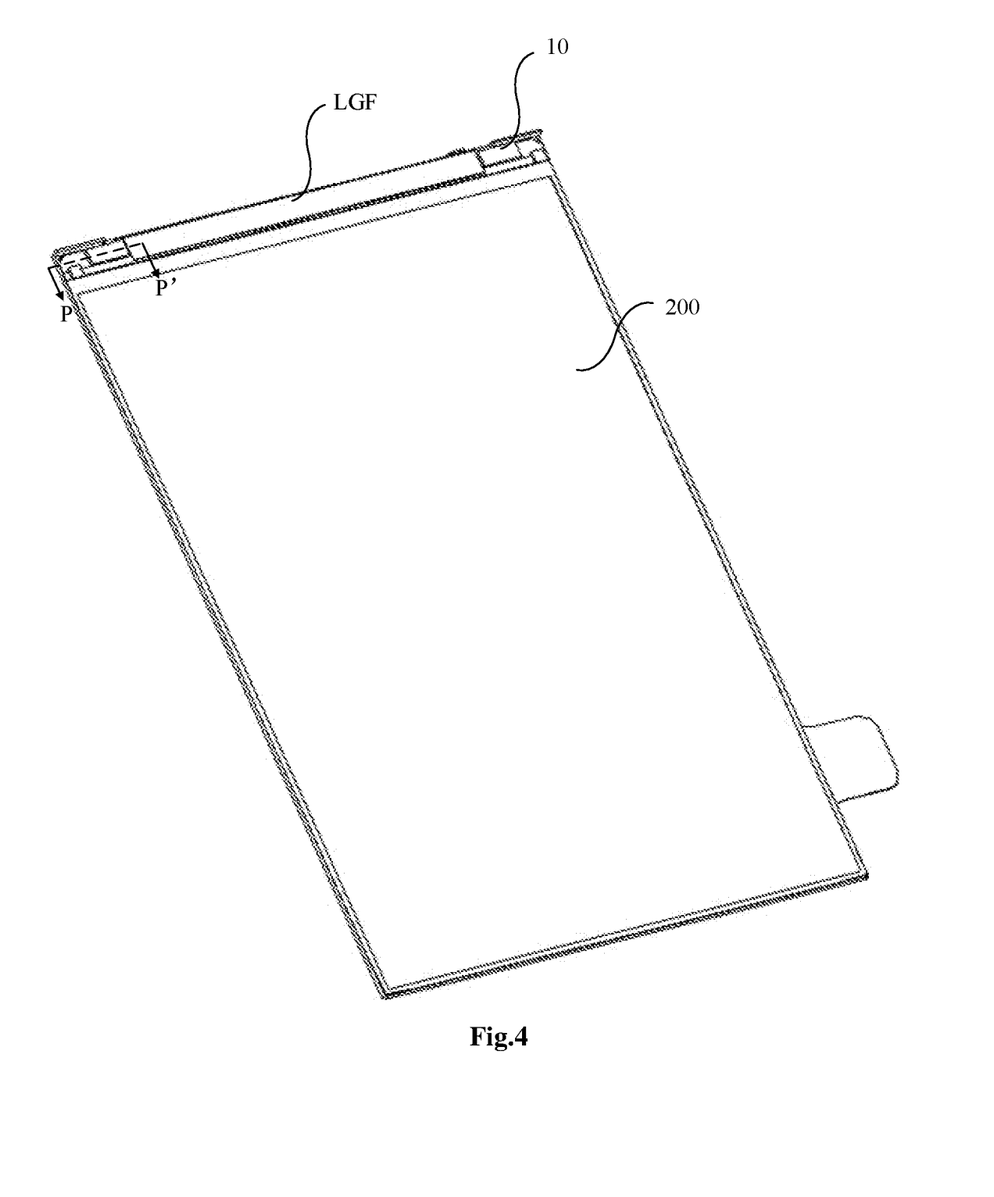
FIG. 4 illustrates a partial structural schematic view of a display device according to an embodiment of the disclosure.

In a specific embodiment of the disclosure, by way of example, on a basis of the condition of the backlight lamp bar having a flexible circuit board 11 in a form of planar structure, and in a condition that the backlight module comprising above backlight lamp bar 01 (taking the backlight lamp bar 01 as illustrated in FIG. 2 as an example) is applied to a display device, with reference to FIG. 3 and FIG. 4, the single-substrate region A1 of the display panel 200 is hollowed out at a location thereof corresponding to (e.g., being aligned with) the button light source 10 to form a hollowed portion 201 (as illustrated in FIG. 3), so as to expose a light-emergent side of the button light source 10 through the hollowed portion 201 such that the light rays from the light-emergent side of the button light source 10 may exit from the hollowed portion 201 (as illustrated in FIG. 4). And the light guide film LGF is located within the button area, more specifically for example within the single-substrate region A1 thereof. Furthermore, FIG. 5 illustrates a sectional view along line P-P' as illustrated in FIG. 4, and illustrates that a package 300 is further included, e.g., a packaging cover plate. As illustrated in FIG. 5, by way of example, the light guide film LGF is located between the display panel 200 and the package 300 (e.g., a cover glass layer CG), such that the light-emergent side of the button light source 10 is arranged to face towards a light-incident side of the light guide film LGF, and so as to ensure that the light rays originating from the button light source 10 may be outputted through the light guide film LGF as much as possible, so as to minimize loss of light rays and to ensure that the illumination range of the light rays may be sufficient to cover the entire button area and thus to satisfy requirements of the entire button area B on uniform backlight illumination.

In addition, as far as specific setting/configuration of above backlight lamp bar 01, as illustrated in FIG. 3 and FIG. 5, since a portion of the display panel 200 within the single-substrate region A1 may be fixed to the backlight module 100 through a curtain tap 30, therefore, in order to ensure that the light-emergent side of the button light source 10 may be exposed through the hollowed portion 201 within the single-substrate region A1 of the display panel 200, then it is required to set a portion of the curtain tap 30 corresponding to the button light source 10 as the hollowed portion similarly.

Furthermore, it should be noticed that, as far as the light guide film LGF located between the display panel 200 and the package 300 is concerned, e.g., it is configured that the light guide film LGF is supported by the package 300, i.e., the light guide film LGF is attached to a side of the package 300 adjacent to the display panel 200; or alternatively, it is for example configured that the light guide film LGF is supported by the display panel 200, i.e., the light guide film LGF is attached to a side of the display panel 200 adjacent to the package 300. However, since there is generally a complex circuit structure being provided at a location of the display panel 200 corresponding to the light guide film LGF, then it may be difficult to ensure an attachment force between the display panel and the light guide film LGF, smoothness or levelling of the light guide film LGF, and the like, in a condition that the light guide film LGF is supported by the display panel 200. Therefore, in the embodiment of the disclosure, the light guide film LGF is for example chosen to be supported by the package 300.

Figure 7:
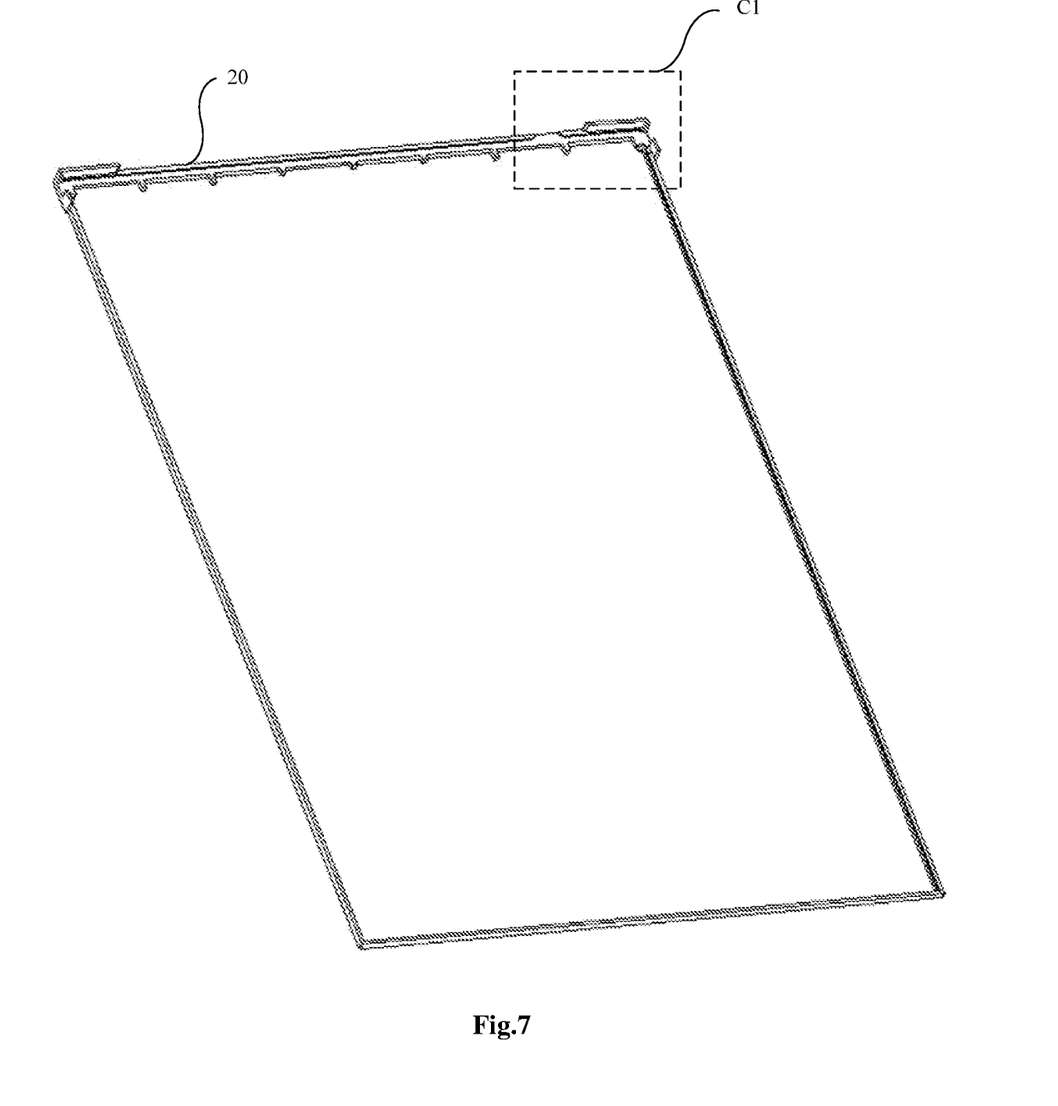
FIG. 7 illustrates a structural schematic view of a sealing frame according to an embodiment of the disclosure.
Figure 8:
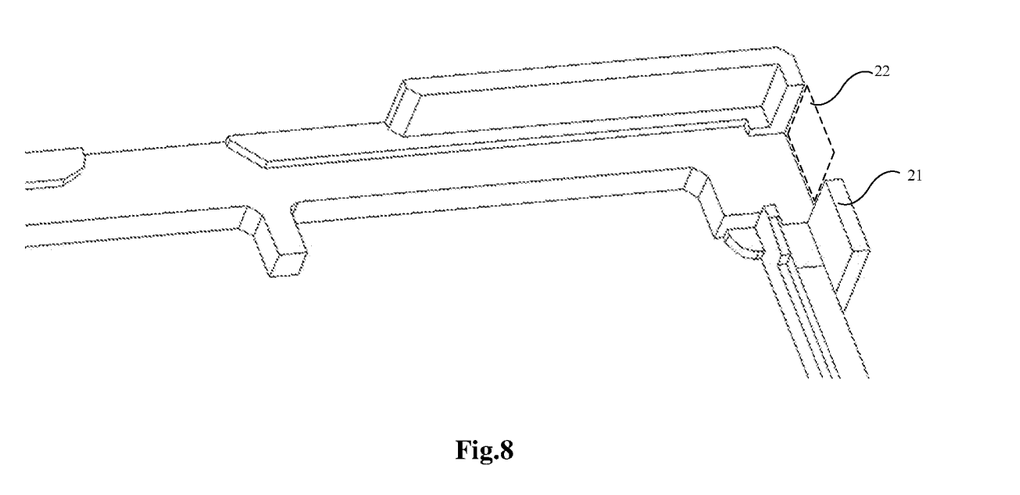
FIG. 8 illustrates an enlargement view of a portion labeled 'C1' as illustrated in FIG. 7.
Figure 9A:
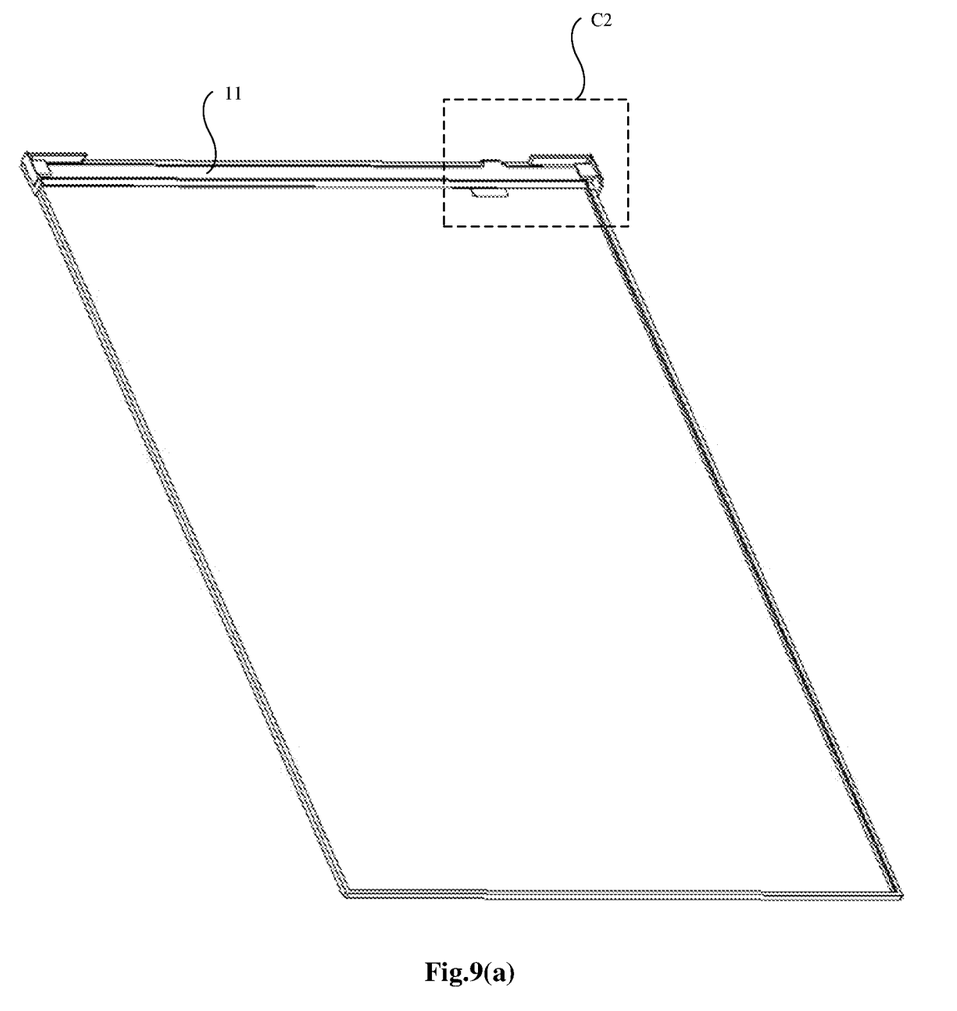
FIG. 9(a) illustrates a structural schematic view of both a sealing frame and a lamp bar according to an embodiment of the disclosure.
Figure 9B:
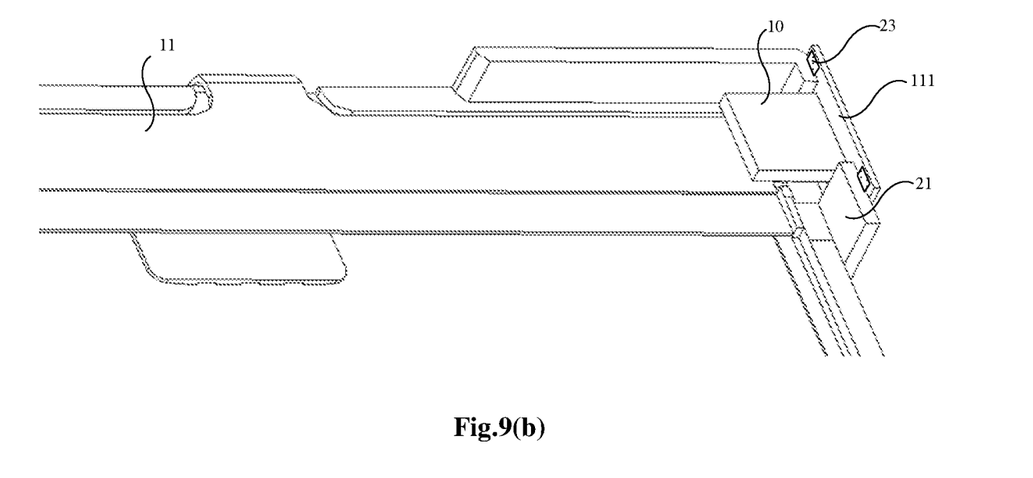
FIG. 9(b) illustrates an enlargement view of a portion labeled 'C2' as illustrated in FIG. 9(a)
Figure 10:
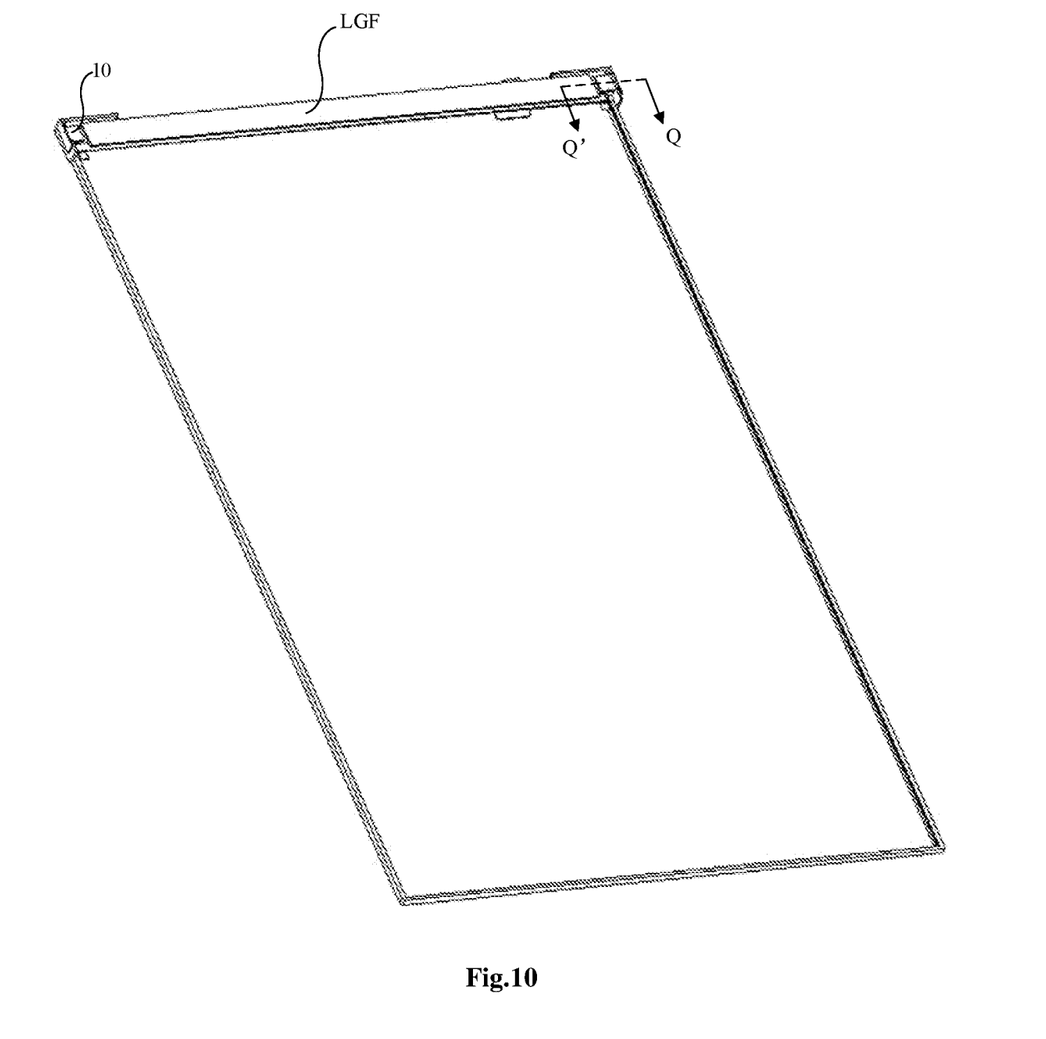
FIG. 10 illustrates a partial structural schematic view of a light guide film according to an embodiment of the disclosure.

In another specific embodiment of the disclosure, by way of example, on a basis of the condition that one end of the flexible circuit board at which the button light source is provided is arranged to bend towards a side of the flexible circuit board facing away from the backlight source, and in a condition that the backlight module comprising above backlight lamp bar 01 (taking the backlight lamp bar 01 as illustrated in FIG. 6 as an example) is applied to a display device, with reference to FIG. 7 and FIG. 8 (i.e., an enlargement view of a portion labeled 'C1' as illustrated in FIG. 7), a barrier wall 21 is provided at portions of a sealing frame (which is provided at a periphery of the backlight lamp bar 01) corresponding to (e.g., being aligned with) ends of the backlight lamp bar 01 in a lengthwise direction of the backlight lamp bar 01, and the barrier wall 21 is provided with a notch 22. As such, in view of FIG. 9(*a*) and FIG. 9(*b*) (i.e., an enlargement view of a portion labeled 'C2' as illustrated in FIG. 9(*a*)), during mounting/fixation, the end of the flexible circuit board on which the button light source 10 is provided is arranged to be in contact with an external side of the barrier wall 21, such that the light-emergent side of the button light source 10 is arranged to extend into an inner side of the barrier wall 21 through the notch 22; and as illustrated in FIG. 10 and FIG. 11, the display panel is provided on the backlight lamp bar and is surrounded by the sealing frame, and the light guide film LGF is provided within the button area B (i.e., the single-substrate region A1) at the inner side of the barrier wall 21 of the sealing frame 20, and between the display panel 200 and the package 300, such that the light-emergent side of the button light source 10 is arranged to face towards a light-incident surface of the light guide film LGF, and so as to ensure that the light rays originating from the button light source 10 may be outputted through the light guide film LGF as much as possible, so as to minimize loss of light rays and to ensure that the illumination range of the light rays may be sufficient to cover the entire button area and thus to satisfy requirements of the entire button area B on illumination of the backlight. FIG. 11 illustrates a sectional schematic view along line Q-Q' as illustrated in FIG. 10, in a condition that the package 300 is included in FIG. 10.

It should be noticed that, as far as the light guide film LGF located between the display panel 200 and the package 300 is concerned, for example, it is configured that the light guide film LGF is supported by the package 300, i.e., the light guide film LGF is attached onto a side of the package 300 adjacent to the display panel 200; or alternatively, it is for example configured that the light guide film LGF is supported by the display panel 200, i.e., the light guide film LGF is attached onto a side of the display panel 200 adjacent to the package 300. However, since there is generally a complex circuit structure being provided at a location of the display panel 200 corresponding to the light guide film LGF, then it may be difficult to ensure an attachment force between the display panel and the light guide film LGF, smoothness or levelling of the light guide film LGF, and the like, in a condition that the light guide film LGF is supported by the display panel 200. Therefore, in the embodiment of the disclosure, the light guide film LGF is for example chosen to be supported by the package 300.

In addition, in a condition that the backlight module which comprises above backlight lamp bar 01 as illustrated in FIG. 6 is applied to the display device, in order to decrease as much as possible adverse effects applied by the bending portion 111 on the display device, the adverse effects being for example a problem that a display device having the bending portion 111 may have a side frame whose width is larger than a width of each of other display devices without the bending portion as illustrated in other figures, then, in the embodiment of the disclosure, in the flexible circuit board 11, both ends thereof at each of which the button light source 10 is provided may be configured to be perpendicular to a longitudinal portion thereof having the backlight source 12 between the both ends, i.e., the bending portion 111 is perpendicular to the portion having the backlight source 12 and between the both ends, such that the side frame of the display device may be enlarged/expanded merely at the ends thereof at each of which the button light source is provided, so as to decrease a relatively large overall width of the side frame of the display device due to the existence of the bending portion 111, as much as possible.

Furthermore, in order to ensure that positions of the bending portion 111 and the button light source 10 provided at the bending portion 111 are relatively stable, so as to avoid any displacement in the relative position of the bending portion 111 during a subsequent mounting/installation or application, and a movement of the button light source 10 thus caused, then, in the embodiment of the disclosure, as illustrated in FIG. 9(*b*), by way of example, within the flexible circuit board 11, the ends thereof (i.e., the bending portion 111) on which the button light source 10 is provided is configured to be adhered to the external side of the barrier wall 21 by an adhesive film 23, so as to avoid any movement of the bending portion 111 and any offset of the position of the button light source 10 thus caused.

It should be noticed that, a lamp bar structure having the bending portion 111 in the embodiment, may for example be directly manufactured into a bent shape in machining; and may also for example be formed into a planar bar shape in an alternative embodiment, and in turn be folded over to form above bending portion 111 during its installation. No restriction is made in this connection in embodiments of the disclosure.

Embodiments of the disclosure have beneficial effects as below:

According to embodiments of the disclosure, a backlight lamp bar, a backlight module and a display device are provided, the backlight lamp bar comprising a flexible circuit board, and both a backlight source and a button light source provided on the flexible circuit board; the backlight source and the button light source are located on two opposite faces of the flexible circuit board perpendicular to a thickness direction thereof, respectively, and power supply terminals of the backlight source and the button light source are electrically connected with circuits on the flexible circuit board, respectively. In other words, the backlight source and the button light source may be controlled simultaneously by one flexible circuit board, i.e., when it is applied onto the display device, the button light source is directly controlled by the flexible circuit board in the backlight lamp bar, so as to avoid a problem that a thickness of the display device may be relatively large due to the flexible circuit board additionally and separately provided between the display panel and the packaging cover plate.

Although embodiments of the disclosure are already illustrated and depicted as above, it should be appreciated for those skilled in this art that the above embodiments are only exemplary embodiments intended to illustrate the operation principle of the disclosure, rather than being limited thereto. As to those skilled in the art, various variations and/or modifications may be made in these embodiments, without departing from the principles and spirit of the disclosure, and these variations and/or modifications still lie within the scope of present application.

The above description merely refers to some specific embodiments of the present disclosure, but the scope of the present disclosure is not limited thereto. Changes or substitutions may be readily envisaged by those skilled in the art within the technical scope of the present disclosure, and such changes or substitutions should be covered within the scope of the present disclosure. Therefore, the scope of the present disclosure should be defined by the scope of the appending claims and their equivalent.

What is claimed is:

1. A backlight lamp bar, comprising:
a flexible circuit board; and
a backlight source and a button light source, both being provided on the flexible circuit board,
wherein the backlight source and the button light source are located on two opposite faces of the flexible circuit board perpendicular to a thickness direction thereof, respectively;
wherein the backlight lamp bar further comprises a light guide film located at a light-emergent side of the button light source, and a sealing frame is provided at a periphery of the backlight lamp bar;
wherein at least one end of the flexible circuit board on which the button light source is provided is arranged to bend towards a side of the flexible circuit board facing away from the backlight source, a barrier wall is provided at portions of the sealing frame being aligned with ends of the backlight lamp bar in a lengthwise direction of the backlight lamp bar, and the barrier wall is provided with a notch; and
wherein at least one end of the flexible circuit board on which the button light source is provided is arranged to be in contact with an external side of the barrier wall such that the light emergent side of the button light source extends into an inner side of the barrier wall through the notch and faces towards the light-incident surface of the light guide film.

2. The backlight lamp bar according to claim 1, wherein the button light source comprises a first button light source and a second button light source, the light guide film being provided between the first button light source and the second button light source.

3. The backlight lamp bar according to claim 1, wherein power supply terminals of the backlight source and the button light source are electrically connected with circuits on the flexible circuit board, respectively.

4. The backlight lamp bar according to claim 1, wherein the button light source comprises: a first button light source located at a first end of the flexible circuit board.

5. The backlight lamp bar according to claim 4, wherein a light-emergent side of the first button light source is arranged to face towards a second end of the flexible circuit board, the second end being opposite to the first end.

6. The backlight lamp bar according to claim 4, wherein the button light source further comprises a second button light source located at a second end of the flexible circuit board, the second end being opposite to the first end.

7. The backlight lamp bar according to claim 6, wherein a light emergent side of the second button light source is arranged to face towards the first end of the flexible circuit board.

8. The backlight lamp bar according to claim 7, wherein the flexible circuit board is in a form of planar structure.

9. The backlight lamp bar according to claim 1, wherein the at least one end of the flexible circuit board is arranged perpendicular to portions of the flexible circuit board having the backlight source thereon.

10. The backlight lamp bar according to claim 1, wherein each of the backlight source and the button light source is LED.

11. A backlight module, comprising the backlight lamp bar according to claim 1.

12. A display device, comprising:
the backlight module according claim 11; and
a display panel provided on the backlight module.

13. The display device according to claim 12, wherein the flexible circuit board is in a form of planar structure, the display panel is hollowed out at a location thereof being aligned with the button light source to form a hollowed portion, and the hollowed portion is arranged to expose a light-emergent side of the button light source through the hollowed portion to face towards a light-incident surface of the light guide film.

14. The display device according to claim 12, wherein at least one end of the flexible circuit board on which the button light source is provided is arranged to bend towards a side of the flexible circuit board facing away from the backlight source, and the at least one end is configured to be adhered to the external side of the barrier wall by an adhesive film.

* * * * *